July 9, 1968 R. L. WHITE 3,392,352
TIME DELAY CIRCUIT
Filed Dec. 28, 1965

INVENTOR
RICHARD L. WHITE
BY
John J. McLaughlin
ATTORNEY

United States Patent Office 3,392,352

Patented July 9, 1968

3,392,352

TIME DELAY CIRCUIT

Richard L. White, Paradise Valley, Ariz., assignor to Dickson Electronics Corporation Filed Dec. 28, 1965, Ser. No. 517,043
6 Claims. (Cl. 331—111)

The present invention relates to time delay devices, and more specifically, to time delay circuits wherein a predetermined time delay is developed after the application of a voltage thereto.

Time delay devices are utilizd in a varity of electronic systems and are required in many instances to delay the application or the removal of a voltage from a particular load. In these applications, it is desirable to maintain a constant delay under varying conditions such as supply voltage regulation and temperature variation. Prior art time delay circuits have tended to become complex and expensive when an attempt is made to provide uniformity of time delay under these varying conditions.

It is therefore an object of the present invention to provide a time delay circuit that generates a delay after a voltage has been applied thereto.

It is also an object of the present invention to provide a time delay circuit providing a time delay substantially independent of voltage regulation of the supply voltage.

It is still another object of the present invention to provide a time delay circuit capable of imposing longer time delays from given delay components than obtainable from prior art circuits.

It is still another object of the present invention to provide a time delay circuit that may be adapted for use at temperature extremes by appropriate selection of circuit components.

These and other objects of the present invention will become apparent to those skilled in the art as the description thereof proceeds.

Briefly, in accordance with one embodiment of the present invention, a field effect transistor is connected into a capacitor charging circuit. The voltage present on the capacitor is sensed by a Zener diode which, when the Zener voltage is reached, admits a gating current to a silicon controlled rectifier connected between an input and output terminal.

The present invention may more readily be described by reference to the accompany drawings in which.

Figure 1:
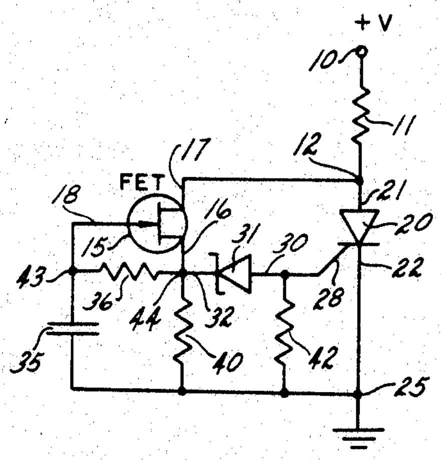
FIG. 1 is a schematic circuit diagram of a time delay circuit constructed in accordance with the teachings of the present invention.

Referring to FIG. 1, a terminal 10 is shown connected to a suitable source of voltage (not shown). In the embodiment chosen for illustration, the time delay circuit is to be connected in series with a load 11. The load is connected to a first terminal 12 of the time delay circuit. A field effect transistor 15 is provided having a source electrode 16, a drain electrode 17, and a gate electrode 18. The drain electrode 17 is connected to the terminal 12. A silicon controlled rectifier 20 is provided having its anode electrode 21 connected to the terminal 12 and its cathode electrode 22 connected to a time delay circiut second terminal 25. The gating electrode 28 of the silicon controlled rectifier 21 is connected to the anode electrode 30 of a Zener diode 31, the cathode electrode 32 of which is connected to the source electrode 16 of the field effect transistor 15. A charging capacitor 35 is connected on one side of the gate electrode 18 of the field effect transistor and is connected to the terminal 25 at the other side thereof. A charging resistor 36 is connected between the gate electrode 18 and the cathode electrode 32 of the Zener diode 31. A source resistor 40 is connected between the source electrode 16 and the terminal 25. Resistance 42 is connected between the gating electrode 28 and the terminal 25 for thermo stability.

The operation of the circuit of FIG. 1 may be described in general terms, and then more specifically described by reference to the derivation of a circuit equation to indicate the development of the time delay. When the voltage is applied to the time delay circuit of FIG. 1 through the load 11, the field effect transistor 15 will be gated on and charging current will begin flowing through the charging resistor 36 to the capacitor 35. The silicon controlled rectifier 20 will be gated to its off or open state and the voltage across the terminals 12 and 25 will be substantially equal to the voltage applied to the terminal 10. As the charge accumulates on capacitor 35, the voltage on the capacitor (the voltage at point 43) will rise and the voltage at point 44 will rise. As the voltage on point 44 continues to rise, the Zener voltage of the Zener diode 31 is reached whereupon gating current is supplied to the gating electrode 28 of the silicon controlled rectifier. The rectifier is thus gated to its conducting condition and the voltage across terminals 12 and 25 suddenly drops from substantially the voltage supplied to the terminal 10 to the forward voltage drop of the silicon controlled rectifier 20. The result of the voltage change across terminals 12 and 25 is the application of substantially the full terminal voltage to the load 11. The charge accumulated on the capacitor 35, after the gating of silicon controlled rectifier 20, may be discharged through the gate-to-drain electrodes of the field effect transistor. The time delay circuit is thus effectively reset and is in condition to impose a similar delay when the supply voltage is reapplied.

Figure 4:
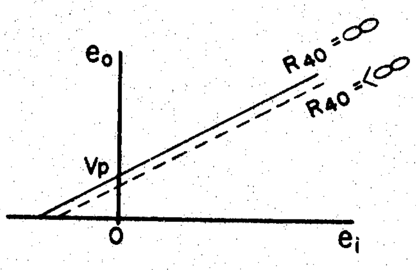
FIG. 4 is a source follower characteristic of a typical field effect transistor useful in describing the operation of the circuit of the present invention.

The time delay circuit of FIG. 1 is capable of generating a higher time delay than prior art circuits using the same value of capacitor 35 and charging resistor 36. This phenomena may more readily be explained by referring to FIG. 4 showing a source follower characteristic for a field effect transistor. The characteristic shows the rise in output voltage $e_o$ accompanying a rise in input voltage $e_i$ for a source resistance of infinity. The characteristic begins at a voltage equal to the pinchoff voltage of the field effect transistor. The dashed line indicates the ratio of input to output voltage when the source resistance of the FET is less than infinity but still very high (100K). Applying FIG. 4 to FIG. 1, the pinchoff voltage $V_p$ is the voltage at point 44 when the supply voltage is first applied to the terminal 12 through the load 11. The output voltage $e_o$ represents the voltage existing at point 44 as the capacitor 35 charges; the input voltage $e_i$ represents the voltage at the input or gate electrode 18 of the field effect transistor and is thus the voltage existing at point 43. In the following derivation, we will assume the following:

$e_0$=voltage at point 44
$I$=charging current (current through resistor 36)
$C$=capacitance of capacitor 35
$R$=resistor 36
$V_z$=Zener voltage of the Zener diode 31

With the above assumed, we may write:

$$e_0 = IR + 1/C \int I dt$$

differentiating, the constant term IR is eliminated $$de_0 = I/C \, dt$$

integrating $$e_0 = (I/C)t + K$$

at $t=o$, $e_0 = V_p$, therefore $$e_0 = I/C + V_p$$

since $$I = \frac{e_o}{R} = \frac{V_p}{R}$$

then $$e_o = \frac{V_p}{RC} t + V_p$$

when $e_o$ reaches the Zener voltage $V_z$, let $t=T$, thus $$V_z = \frac{V_p}{RC} T + V_p$$

solving for T:

$$T = \left(\frac{V_z}{V_p} - 1\right) RC$$

From the above equations, it may be seen that the total time T is a function of the RC time constant of the circuit and aslo the ratio of the Zener voltage to the pinchoff voltage of the field effect transistor. Therefore, the delay time T is independent of the supply voltage. Further, the charging time is a linear function. A result of the linearity of the time delay is illustrated in FIG. 3.

Figure 3:
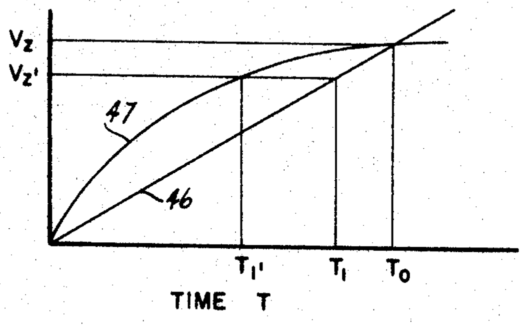
FIG. 3 illustrates capacitor voltage as a function of time and the relationship of the capacitor voltage to the Zener voltage.

Referring to FIG. 3, the voltage at point 44 is illustrated by the straight line curve 46. Following the straight line 46, it may be seen that when the Zener voltage $V_z$ is reached the total time elapsed will be $T_0$; however, if the Zener voltage varies (such as by the influence of a temperature change), and is lowered to a new value $V_z'$, the new total elapsed time will be $T_1$. Prior art non-linear charging times are illustrated by the curve 47 wherein it may be seen that at the design Zener voltage of $V_z$, the elapsed time will be $T_0$; however, if, as in the illustration previously discussed, the Zener voltage is reduced to $V_z'$, then the result of the non-linearity of the voltage represented by the curve 47 is the new elapsed time of $T_1'$. The overall result if evidenced by the time differential between the times $T_1$ and $T_1'$ of FIG. 3 showing the greater deviation from a design or desired time $T_0$ when a prior art time delay circuit is utilized.

Figure 2:
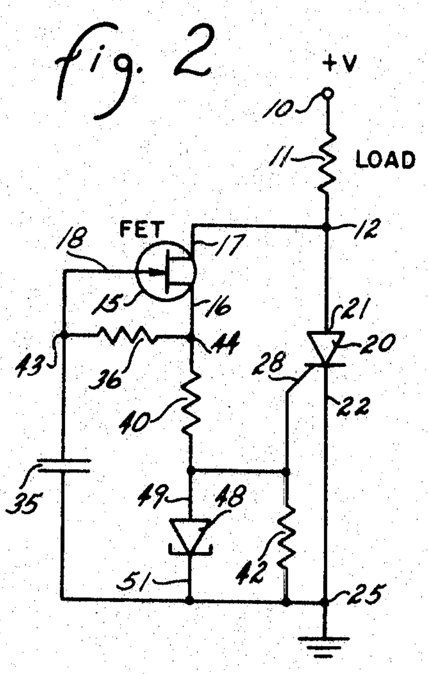
FIG. 2 is a circuit diagram of a time delay circuit showing another embodiment of the present invention.

In those applications where a time delay is to be utilized in a high voltage environment (e.g., 100 volts or higher), it may be desirable to utilize a triggering device other than the Zener diode 31 shown in FIG. 1. This is particularly true when the device is to be subjected to temperature variations since Zener temperature coefficients are generally poor at high voltage. The embodiment shown in FIG. 2 utilizes current flowing through a tunnel diode to trip the silicon controlled rectifier rather than the voltage sensed by the Zener diode of FIG. 1. Referring to FIG. 2, it may be seen that most of the elements therein are the same as in FIG. 1 and are numbered accordingly. A tunnel diode 48 is connected through its anode electrode 49 to the gating electrode 28 of the silicon controlled rectifier 20. The anode electrode is also connected to the source resistor 40 of the field effect transistor. The cathode 51 of the tunnel diode is connected to the terminal 25. The operation of the circuit of FIG. 2 is the same as that of FIG. 1 with the exception of the sensing of the current through the tunnel diode 48 to cause it to switch impedance states and to thereby gate the silicon controlled rectifier.

A variety of gating means may be utilized in place of the silicon controlled rectifier shown in FIGS. 1 and 2; similarly, while field effect transistors have been found to be uniquely applicable to the embodiments chosen for illustration, other voltage control devices connected in configurations equivalent to the source follower configuration may be used. The Zener diode or tunnel diode arrangements are convenient triggering devices responsive to the voltage or current in the capacitor charging circuit and may therefore be replaced by similar devices or circuits capable of providing a suitable triggering or gating signal to the controlled rectifier.

Various modifications may be made in my invention without departing from the spirit or scope thereof, and it is to be understood that I limit myself only as defined by the appended claims.

I claim:

1. A time delay circuit comprising: a first and a second terminal; gating means having a control electrode, an input electrode, and an output electrode; means connecting said input electrode to said first terminal and said output electrode to said second terminal; a voltage control device having an input electrode, an output electrode, and a control electrode, said input electrode connected to said first terminal; a capacitor having one electrode connected to the control electrode of said voltage control device and another electrode connected to said second terminal; a charging resistor connected between the control electrode of said voltage control device and the output electrode of said voltage control device; and means connected to the output electrode of said voltage control device, to the control electrode of said gating means, and to said second terminal responsive to the voltage on said capacitor for gating said gating means.

2. A time delay circuit as defined in claim 1 wherein said gating means is a controlled rectifier and said control, input, and output electrodes are the gate, anode, and cathode electrodes of the controlled rectifier respectively.

3. The time delay circuit defined in claim 1 wherein said voltage control device is a field effect transistor and wherein said input, output, and control electrodes of said voltage control device are the drain, source, and gate electrodes respectively of said field effect transistor.

4. A time delay circuit defined in claim 2 wherein said voltage control device is a field effect transistor and wherein said input, output, and control electrodes of said voltage control device are the drain, source, and gate electrodes respectively of said field effect transistor.

5. A time delay circuit comprising: a first and second terminal; a controlled rectifier having an anode electrode connected to said first terminal, a cathode electrode connected to said second terminal, and a gating electrode; a field effect transistor having a drain electrode connected to said first terminal and having source and gate electrodes; a capacitor having one electrode connected to the gate electrode of said field effect transistor and another electrode connected to said second terminal; a charging resistor connected between the gate and source electrodes of said field effect transistor; a Zener diode having an anode connected to the gate electrode of said controlled rectifier and having a cathode electrode connected to the source electrode of said field effect transistor and to said second terminal through a resistor.

6. A time delay circuit comprising: a first and a second terminal; a controlled rectifier having an anode electrode connected to said first terminal, a cathode electrode connected to said second terminal, and a gating electrode; a field effect transistor having a drain electrode connected to said first terminal and having source and gate electrodes; a capacitor having one electrode connected to the gate electrode of said field effect transistor and another electrode connected to said second terminal; a charging resistor connected between the gate and source electrodes of said field effect transistor; a tunnel diode having an anode electrode connected through a resistor to the source electrode of said field effect transistor and connected to the gate electrode of said controlled rectifier, and having a cathode electrode connected to said second terminal.

No references cited.

ARTHUR GAUSS, *Primary Examiner.*

S. D. MILLER, *Assistant Examiner.*